United States Patent
Kundalgurki

(10) Patent No.: US 7,284,558 B2
(45) Date of Patent: Oct. 23, 2007

(54) ENHANCED MEGASONIC BASED CLEAN USING AN ALTERNATIVE CLEANING CHEMISTRY

(75) Inventor: Srivatsa Kundalgurki, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/058,723

(22) Filed: Feb. 15, 2005

(65) Prior Publication Data

US 2006/0180172 A1 Aug. 17, 2006

(51) Int. Cl.
*B08B 6/00* (2006.01)
(52) U.S. Cl. .............................. 134/1.3; 134/1; 134/2; 134/19; 510/175; 438/906
(58) Field of Classification Search ............... 510/175, 510/176; 134/2, 19, 1, 1.3; 438/906
See application file for complete search history.

(56) References Cited

U.S. PATENT DOCUMENTS

| | | | |
|---|---|---|---|
| 5,143,103 A * | 9/1992 | Basso et al. ................ | 134/98.1 |
| 5,922,136 A * | 7/1999 | Huang ............................ | 134/2 |
| 6,430,965 B2 * | 8/2002 | Eda et al. ................... | 65/30.14 |
| 2005/0081884 A1 * | 4/2005 | Ramachandran et al. ...... | 134/2 |

FOREIGN PATENT DOCUMENTS

| | | | |
|---|---|---|---|
| JP | 10-27771 | * | 1/1998 |
| JP | 2000-195833 | * | 7/2000 |

* cited by examiner

*Primary Examiner*—M. Kornakov
(74) *Attorney, Agent, or Firm*—Jenkins, Wilson, Taylor & Hunt, P.A.

(57) ABSTRACT

The present invention relates to the use of a $C_1$ to $C_5$ alcohol during the cleaning step. With the use of said alcohol, the surface tension of the solution is reduced which allows the application of reduced megasonic power with increased cleaning efficiency.

18 Claims, 4 Drawing Sheets

ENHANCED MEGASONIC BASED CLEAN USING AN ALTERNATIVE CLEANING CHEMISTRY

TECHNICAL FIELD

The present invention relates to the use of an alcohol to enhance the megasonic cleaning efficiency during the wet clean of semiconductor wafers.

BACKGROUND ART

During the production of semiconductors, residues and defects have to be removed from a semiconductor wafer. To remove residues, an industry proven solution called Standard Clean-1 (SC-1) is used. The SC-1 solution comprises deionized (DI) water, ammonium hydroxide ($NH_4OH$) or ammonia ($NH_3$) and hydrogen peroxide ($H_2O_2$). A typical concentration of such an SC-1 solution is 50 parts by volume of DI water, 2 parts by volume of hydrogen peroxide and 1 part by volume of ammonium hydroxide. The SC-1 solution is either used exclusively or in combination with megasonic energy to facilitate defectivity reduction.

During the SC-1 clean, etch of an oxide underneath the defect and the presence of electrostatic repulsion between the residue and the wafer facilitates the detachment of the residue from the wafer into the bulk solution where it can be filtered out. When megasonic energy is used in combination with the SC-1 solution, the need for strong oxide underetch to dislodge the residues is minimized since the mechanical action of the megasonic energy supports this function. Therefore, the SC-1 solution in combination with megasonic energy can be significantly diluted to minimize oxide etch thereby minimizing negative impact on devices being fabricated as well as to reduce the costs of the cleaning chemistry.

The use of megasonic waves or megasonic cleaning refers to a cleaning technique where forces released during high frequency cavitation bubble collapse are used to overcome the adhesion forces between the substrate to be cleaned and the undesirable contaminants adhering to it. During the application of megasonic waves, cavitation is induced by cycling the pressure signal being transmitted through the regimes conducive to bubble nucleation and bubble implosion. The frequency of the impressed pressure signal controls the maximum cavitation bubble size. In general, higher megasonic frequency leads to smaller cavitation bubble size and vice versa.

The cleaning efficiency at a particular particle size is a function of the sonic frequency. FIG. 1 shows the relation between particle size and particle removal rate. The cleaning efficiency for cleaning smaller size particles increases with higher sonic frequency. A stagnant liquid boundary layer thickness near the substrate surface reduces as the megasonic frequency is increased. This is illustrated in FIG. 2. For effective particle cleaning, the boundary layer should be smaller than the particles desired to be removed (J. Harman, E. L. Lamm, "The impact of ultrasonic frequency on particle removal", Branson Ultrasonic Corp.).

At constant temperature, if a liquid is subjected to decreasing pressure, the liquid undergoes a phase change when the pressure falls below the vapor pressure of the liquid. Nucleation of the cavitation bubbles in the bulk liquid in the absence of contaminants or solid surfaces is termed homogenous nucleation while nucleation at interfaces is termed heterogeneous nucleation. From theoretical considerations relating to homogenous nucleation it is known that higher megasonic power enhanced by liquid pressure amplitude leads to a higher potential for substrate damage. On the other hand, a reduction of megasonic power also reduces the velocity of microjets which could potentially contribute to damaging sensitive structures on the wafer. For a theoretical background see C. E. Brennen, "Cavitation and Bubble Dynamics", Oxford University Press, 1995.

Hence, if the megasonic power during the cleaning step could be reduced at a similar or even increased cleaning efficiency, the potential damage to structures on the wafer can be reduced.

SUMMARY OF THE INVENTION

It is therefore an aim of the invention to reduce the megasonic power applied during cleaning of semiconductor devices.

While attempting to minimize structural damage during megasonic cleaning, it has been found that the use of a $C_1$ to $C_5$ alcohol in the cleaning solution allows for the reduction of megasonic power while maintaining a reasonable cleaning efficiency level.

The present invention is therefore directed to the use of a $C_1$ to $C_5$ alcohol in the cleaning solution including the SC-1 cleaning solution when megasonic waves are applied to enhance cleaning efficiency. With the use of said alcohol in the solution, the surface tension of the solution is reduced leading to a reduction of the cavitation threshold during the application of megasonic waves. The reduced cavitation threshold minimizes the required pressure amplitude to induce cavitation consequently minimizing damage to semiconductor devices being cleaned.

The alcohol is preferably selected from a group consisting of methanol, ethanol, n-propanol, isopropanol, n-butanol, isobutanol or tert. butanol, or mixtures thereof.

Experiments of having isopropanol in deionized water as the cleaning solution have shown that a cleaning efficiency of up to 50% could be achieved whereas the corresponding cleaning efficiency without the isopropanol additive is about 6% at a megasonic power setting of 300 W. At 100 W megasonic power, the deionized water cleaning solution with isopropanol demonstrated a cleaning efficiency of 26%, significantly higher than the value at 300 W without the isopropanol additive as indicated above.

DETAILED DESCRIPTION OF THE INVENTION

Figure 1:
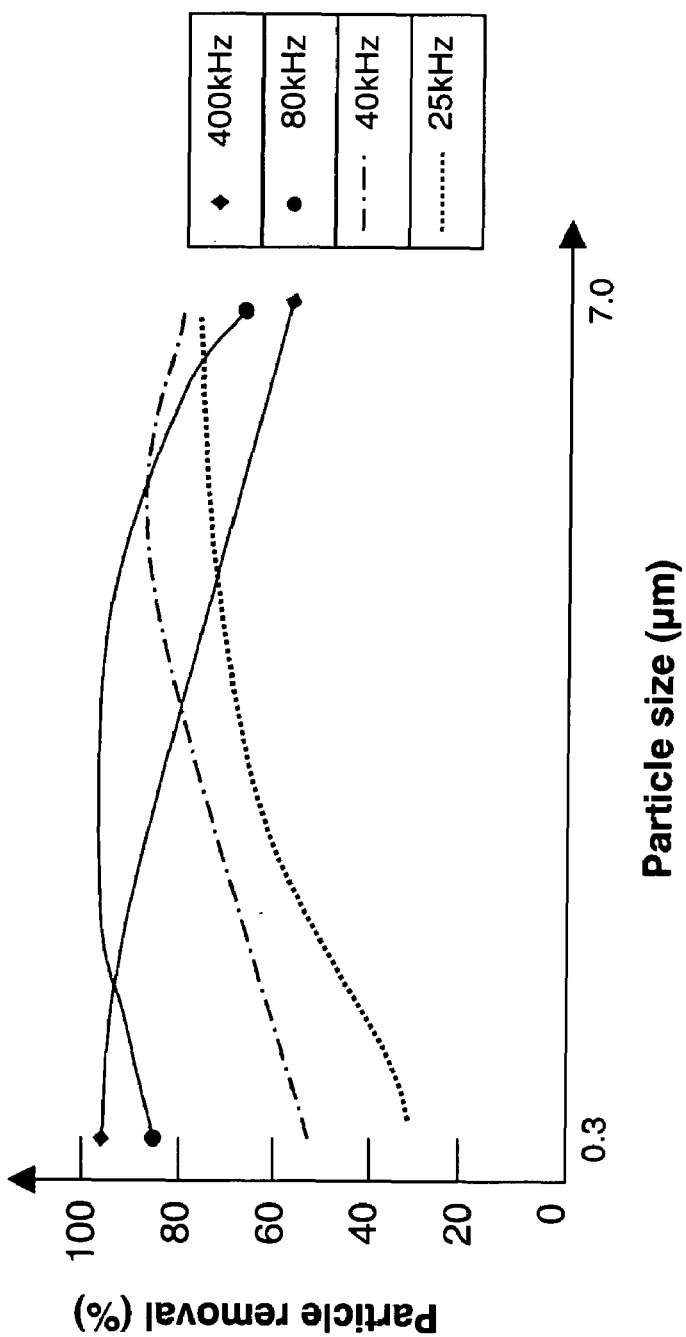
FIG. 1 gives the correlation between the particle size in μm and the cleaning efficiency at different megasonic frequencies.
Figure 2:
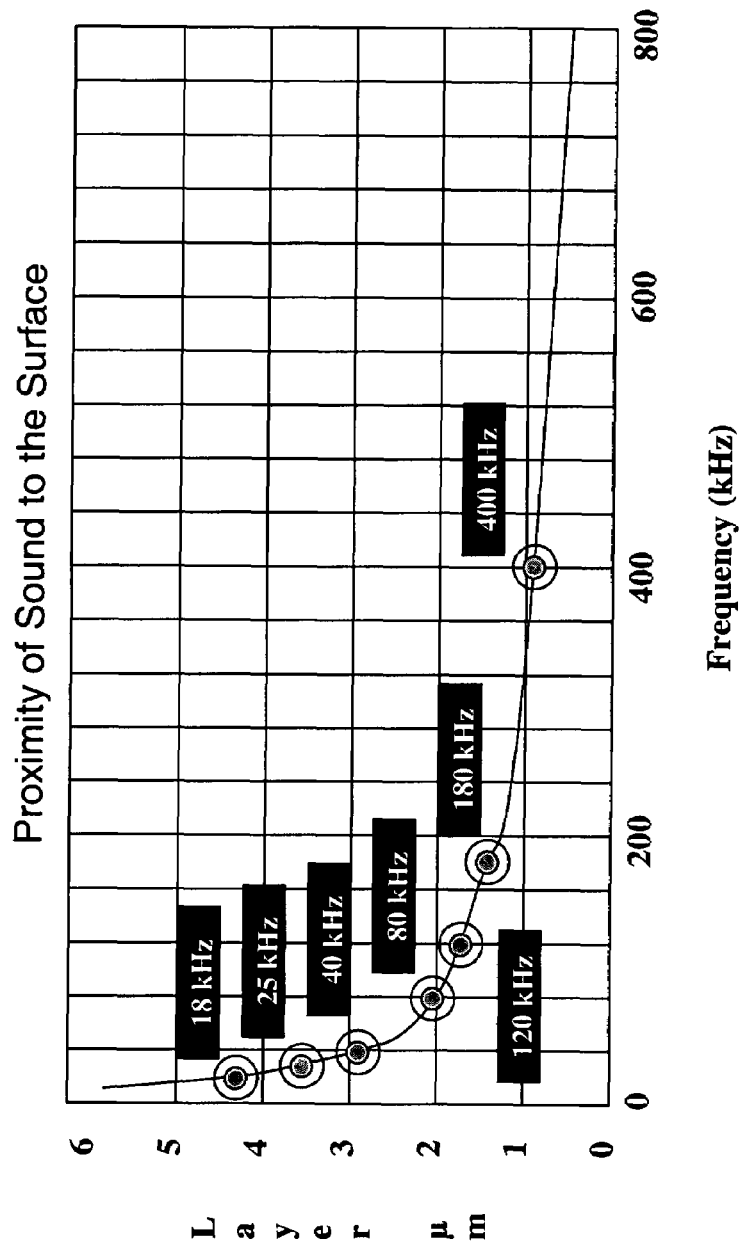
FIG. 2 shows the thickness of the viscous boundary layer in correlation with the megasonic frequency in kHz

The present invention is related to the use of a $C_1$ to $C_5$ alcohol in the cleaning solution when megasonic waves are applied to clean the surface of semiconductor wafers. A $C_1$ to $C_5$ alcohol is an alcohol with 1 to 5 carbon atoms.

Theoretical considerations relating to homogenous nucleation have shown that higher megasonic power enhanced by liquid pressure amplitude leads to a higher potential for substrate damage. The reduction of megasonic power thus reduces the risk of structure damage by reducing the magnitude of the pressure pulse generated during bubble implosion as well as by reducing the velocity of the re-entering microjets as the bubble collapses. By reducing the cavitation threshold of the liquid, a better cleaning efficiency can be achieved at lower megasonic power while the risk of damage to exposed sensitive structures on the wafer is minimized or even eliminated.

A reduction in cavitation threshold and an increase in the number of homogenous nucleation events can be achieved by reducing the surface tension of the cleaning liquid. By increasing the vapor pressure of the cleaning liquid, the temperature of the cleaning liquid could be lowered by maintaining equivalent homogenous nucleation events and hence comparable cleaning efficiency.

During the search for an additive to the cleaning solution the inventor has found that the use of an alcohol allows for reduction of megasonic power. At the same time, the temperature of the cleaning liquid can be lowered and the cleaning efficiency increased. The alcohols used have a high vapor pressure and a low surface tension.

In an aspect of the invention, a process for cleaning a semiconductor part, comprising the steps of providing a cleaning bath for the semiconductor part; adding at least an alcohol of $C_1$ to $C_5$ to said bath to form a solution; contacting said semiconductor part and said solution; and applying megasonic waves to said solution is described.

The $C_1$ to $C_5$ alcohol is a linear or branched, substituted or unsubstituted alcohol. Preferably, methanol, ethanol, n-propanol, isopropanol, n-butanol, iso-butanol or tert-butanol, or mixtures thereof, are used. The most preferred alcohol is isopropanol (IPA). The alcohol is used in the cleaning solution including the SC-1 solution in an amount ranging from 0.1% by volume to 30% by volume, preferably in an amount ranging from 1% by volume to 15% by volume, and most preferably in an amount ranging from 4% by volume to 12% by volume. The most preferred amount is 8% by volume.

The solution is maintained at a temperature during the cleaning in the range of 25° C. to 65° C., preferably in the range of 25° C to 45° C.

The cleaning solution to which the alcohol additive is added could be deionized water or the SC-1 cleaning solution containing deionized water, ammonia or ammonium hydroxide and hydrogen peroxide, preferred in a ratio of $H_2O:NH_4OH:H_2O_2$ of 50:1:2 by volume. Other volume combinations are however possible as well based on the application.

Megasonic energy is typically generated in the range of 850 MHz to 1 GHz with an applied power in the range of 0-100 W.

As examples have shown, the cleaning efficiency is significantly increased with the use of said alcohol. This allows in other words a similar cleaning efficiency at reduced megasonic power and/or at reduced cleaning time.

EXAMPLES

The mechanical cleaning efficiency was tested with wafers contaminated with silicon nitride ($Si_3N_4$) particles. The wafers were cleaned with deionized water without any additives and with a solution of deionized water containing 8% by volume of isopropanol. The frequency of the megasonic energy was fixed at 850 MHz while the applied power was varied between 0 and 300 W.

All wafers were processed on a 200 mm Steag mini-wet bench, configured with a final rinse (FR) module (with megasonic capability) and a Marangoni dryer module. The liquid in the final rinse module was either 100% deionized water or deionized water with 8% by volume of IPA. A comparison is shown in Table 1. The wafers were placed in the indicated cassette slot position in the FR module of wet bench. The megasonic power was applied for 10 minutes with or without overflow as indicated in column 3 of Table 1. The cassette slot position is given in column 1.

TABLE 1

| Wafer slot position in cassette | Applied Megasonic Power | with/without overflow of the cleaning solution | Cleaning Solution | Particle Count (>0.16 microns) before cleaning | Total Particles removed | Cleaning Efficiency (%) |
| --- | --- | --- | --- | --- | --- | --- |
| 12 | 300 W | with | water | 19999 | 1268 | 6 |
| 13 | 300 W | with | water | 18765 | 4000 | 21 |
| 12 | 300 W | without | water | 19994 | 1249 | 6 |
| 13 | 300 W | without | water | 20479 | 2129 | 10 |
| 12 | 300 W | without | IPA solution | 19985 | 9930 | 50 |
| 13 | 300 W | without | IPA solution | 19302 | 9548 | 49 |
| 12 | 200 W | without | IPA solution | 19568 | 8787 | 45 |
| 13 | 200 W | without | IPA solution | 19646 | 8310 | 42 |
| 12 | 100 W | without | IPA solution | 19811 | 5235 | 26 |
| 13 | 100 W | without | IPA solution | 20009 | 7755 | 39 |

Figure 4:
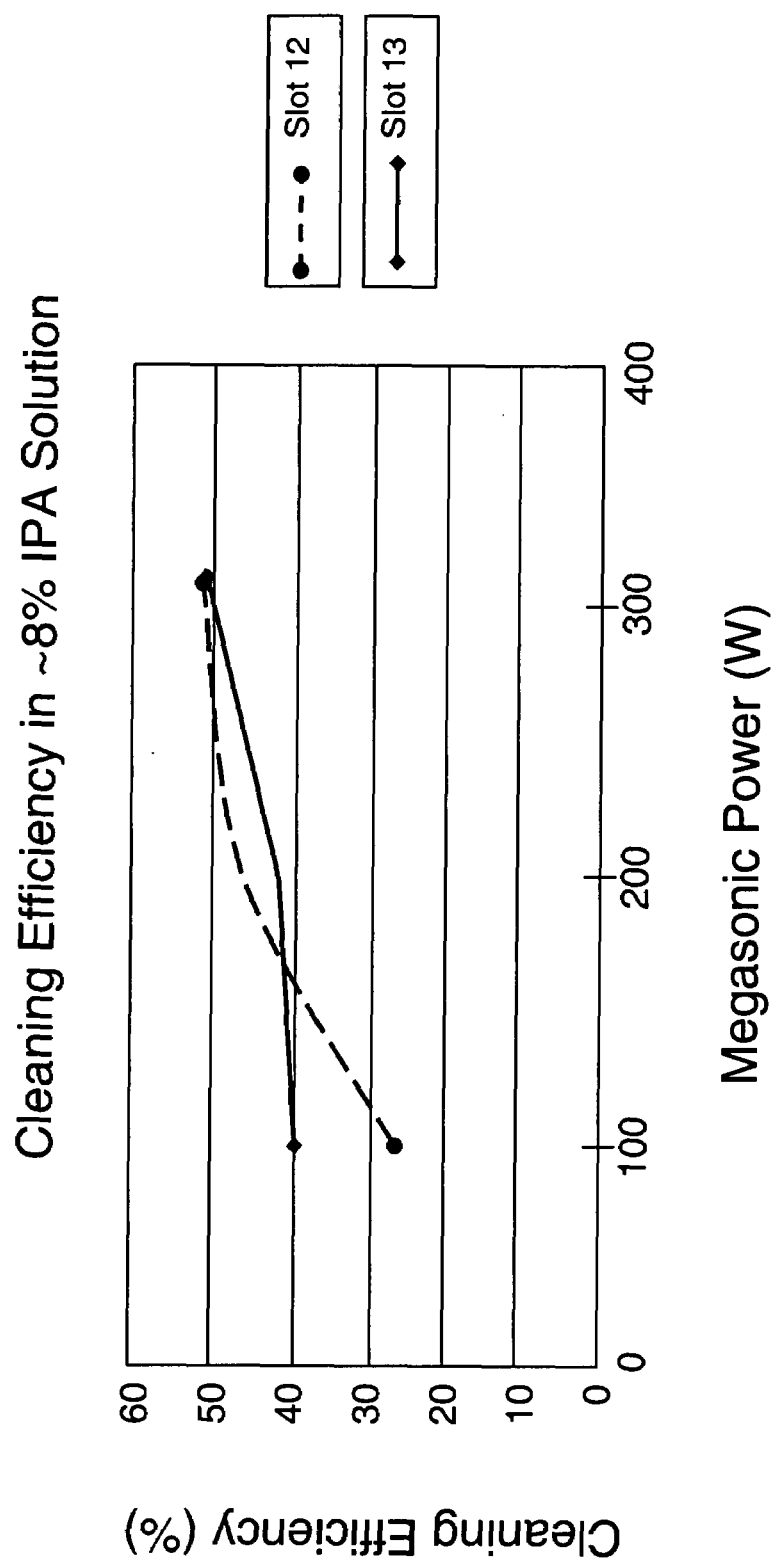
FIG. 4 shows the cleaning efficiency in 8% IPA-solution at different levels of megasonic power without overflow of the cleaning solution.

It is shown that the cleaning efficiency is much higher with the IPA solution compared to the deionized water. Even with a reduced megasonic power of 100 W, it is significantly higher in the IPA-solution than in the deionized water (cf. Table 1). As shown in FIG. 4, the cleaning efficiency has increased to up to 50% at 300 W with a solution containing 8% IPA.

Figure 3:
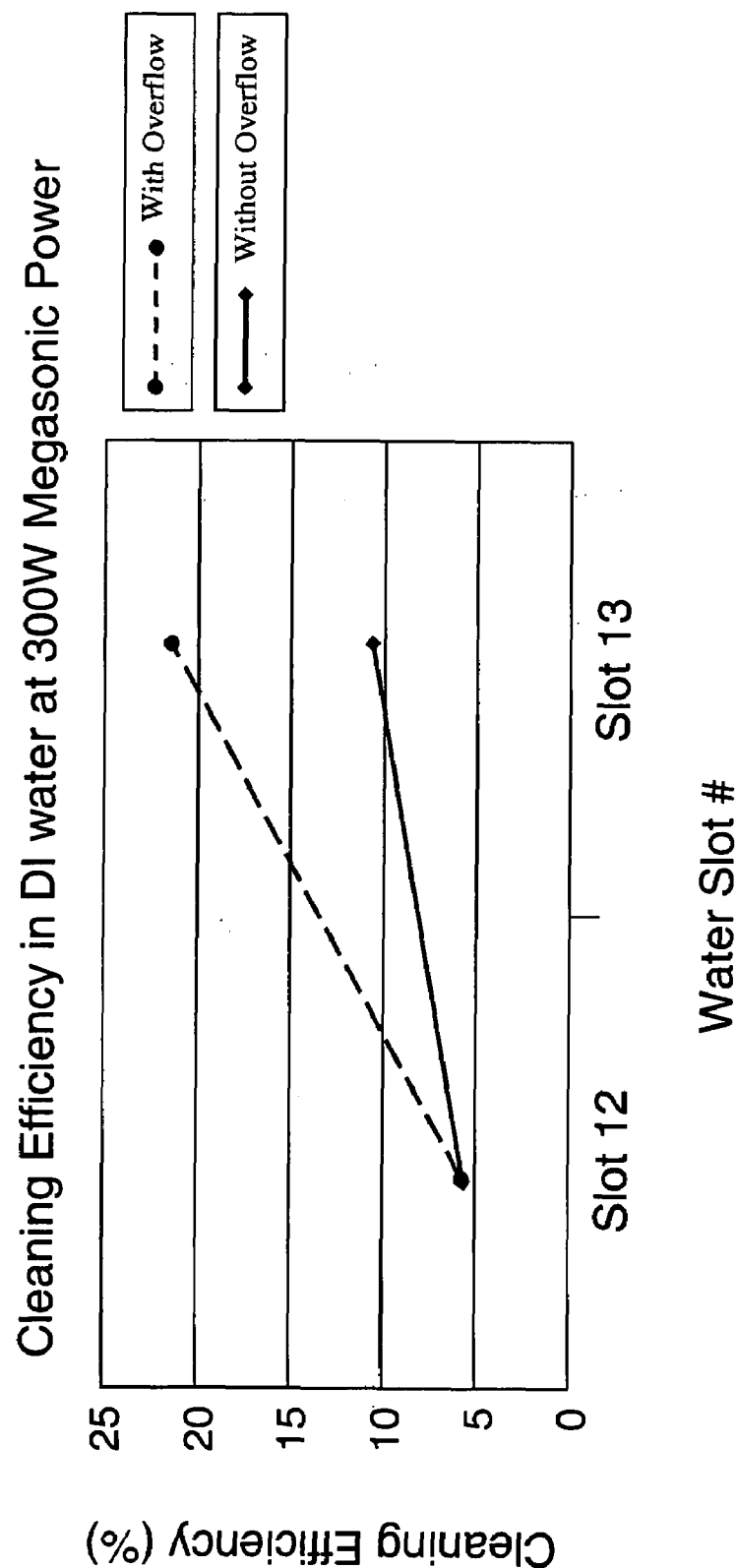
FIG. 3 shows the cleaning efficiency in DI water at 300 W megasonic power against the wafer slot position with and without overflow of the cleaning solution.

In addition to the results above, the slot-to-slot uniformity during the cleaning step is improved. Whereas the cleaning efficiency in deionized water varies widely from slot to slot(see FIG. 3), it is much more uniform with the application of the IPA solution (see FIG. 4).

What is claimed is:

1. A process for cleaning a semiconductor part, comprising the steps of:
    (a) providing a cleaning bath for a semiconductor part, wherein said cleaning bath comprises a first cleaning solution including deionized water, ammonia and hydrogen peroxide;
    (b) adding at least an alcohol of $C_1$ to $C_5$ to said first cleaning solution to form a second cleaning solution;

(c) contacting said semiconductor part and said second cleaning solution; and (d) applying megasonic waves to said second cleaning solution.

2. A process according to claim 1, wherein said alcohol is selected from the group consisting of methanol, ethanol, n-propanol, isopropanol, n-butanol, isobutanol or tert-butanol, or mixtures thereof.

3. A process according to claim 1, wherein said alcohol is isopropanol.

4. A process according to claim 1, wherein said alcohol is used in said second cleaning solution in an amount ranging from 0.1% by volume to 30% by volume.

5. A process according to claim 1, wherein said alcohol is used in said second cleaning solution in an amount ranging from 1% by volume to 15% by volume.

6. A process according to claim 1, wherein said alcohol is used in said second cleaning solution in an amount ranging from 4% by volume to 12% by volume.

7. A process according to claim 1, wherein said second cleaning solution is maintained at a temperature during the cleaning ranging from 25° C. to 65° C.

8. A process according to claim 1, wherein said alcohol is used in said second cleaning solution ranging from 25° C. to 35° C.

9. A process according to claim 1, wherein said first cleaning solution is a mixture of deionized water, ammonia, hydrogen peroxide in a ratio (by volume) of 50:1:2.

10. A process for cleaning a semiconductor part, comprising the steps of:
(a) providing a cleaning bath for a semiconductor part, wherein said cleaning bath comprises a cleaning solution including a mixture of at least a $C_1$ to $C_5$ alcohol, deionized water, hydrogen peroxide, and one of ammonia and ammonium hydroxide;

(b) contacting said semiconductor part and said cleaning solution; and (c) applying megasonic waves to said cleaning solution.

11. A process according to claim 10, wherein said alcohol is selected from the group consisting of methanol, ethanol, n-propanol, isopropanol, n-butanol, isobutanol or tert-butanol, or mixtures thereof.

12. A process according to claim 10, wherein said alcohol is isopropanol.

13. A process according to claim 10, wherein said alcohol is used in said cleaning solution in an amount ranging from 0.1% by volume to 30% by volume.

14. A process according to claim 10, wherein said alcohol is used in said cleaning solution in an amount ranging from 1% by volume to 15% by volume.

15. A process according to claim 10, wherein said alcohol is used in said cleaning solution in an amount ranging from 4% by volume to 12% by volume.

16. A process according to claim 10, wherein said cleaning solution is maintained at a temperature during the cleaning ranging from 25° C. to 65° C.

17. A process according to claim 10, wherein said alcohol is used in said cleaning solution ranging from 25° C. to 35° C.

18. A process according to claim 10, wherein said cleaning solution is a mixture of at least a $C_1$ to $C_5$ alcohol, deionized water, ammonia, and hydrogen peroxide, wherein the deionized water, ammonia, and hydrogen peroxide are present in a ratio (by volume) of 50:1:2.

* * * * *